(12) United States Patent
Chen et al.

(10) Patent No.: US 8,879,332 B2
(45) Date of Patent: Nov. 4, 2014

(54) FLASH MEMORY WITH READ TRACKING CLOCK AND METHOD THEREOF

(75) Inventors: Chung-Kuang Chen, Hsin-chu (TW);
Han-Sung Chen, Hsin-chu (TW);
Chun-Hsiung Hung, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 498 days.

(21) Appl. No.: 13/370,833

(22) Filed: Feb. 10, 2012

(65) Prior Publication Data
US 2013/0208544 A1 Aug. 15, 2013

(51) Int. Cl.
*G11C 16/06* (2006.01)

(52) U.S. Cl.
USPC .............. 365/185.25; 365/233.1; 365/189.07; 365/185.21

(58) Field of Classification Search
CPC ... G11C 16/26; G11C 2207/2281; G11C 7/22
USPC ................ 365/185.25, 233.1, 189.07, 185.21
See application file for complete search history.

(56) References Cited

U.S. PATENT DOCUMENTS

| | | | | |
|---|---|---|---|---|
| 5,754,482 | A * | 5/1998 | Su et al. | 365/189.07 |
| 6,373,753 | B1 * | 4/2002 | Proebsting | 365/189.09 |
| 6,842,377 | B2 * | 1/2005 | Takano et al. | 365/185.21 |
| 2002/0048193 | A1 * | 4/2002 | Tanikawa et al. | 365/185.33 |
| 2002/0093854 | A1 * | 7/2002 | Liu | 365/189.11 |
| 2003/0161183 | A1 * | 8/2003 | Tran | 365/185.03 |
| 2003/0214861 | A1 * | 11/2003 | Takano et al. | 365/200 |
| 2006/0056264 | A1 * | 3/2006 | Worley et al. | 365/230.06 |

* cited by examiner

*Primary Examiner* — Tuan T Nguyen
(74) *Attorney, Agent, or Firm* — Volpe and Koenig, P.C.

(57) ABSTRACT

The configurations of a flash memory having a read tracking clock and method thereof are provided. The proposed flash memory includes a first and a second storage capacitors, a first current source providing a first current flowing through the first storage capacitor, a second current source providing a second current flowing through the second storage capacitor, and a comparator electrically connected to the first and the second current sources, and sending out a signal indicating a developing time being accomplished when the second current is larger than the first current.

15 Claims, 9 Drawing Sheets

FLASH MEMORY WITH READ TRACKING CLOCK AND METHOD THEREOF

FIELD OF THE INVENTION

The present invention relates to a flash memory having a read tracking clock. More particularly, it relates to a flash memory having a read tracking clock with a better efficiency and a lower power loss.

BACKGROUND OF THE INVENTION

For a non-volatile memory, such as a NAND flash memory, the specific operational features of which are that the smallest unit for "erase" is "block" and the unit for "read" and "write" is "page". When the information in a "page" is accessed, the information of the whole "page" is stored in an external memory, and when the RAM is not big enough, the internal sense amplifier is used to store the information of the whole "page", and any data in that "page" can be accessed when the random data input/output is used. Thus, the importance of a buffer, especially the sense amplifier towards a non-volatile memory goes without saying.

In the structure of a NAND flash, the "0" and "1" of the size of a sensing current is defined according to the operating timing. Thus, the various clock timing is required under different conditions. If a stable clock is used, it will result in the sensing noise and the window loss.

It is worth to think about how to tune the clock timing easily in the related areas of the non-volatile memories. If a stable clock is given, that will cause boundary shift of "0" and "1". If the trend of the temperature coefficients of a stable clock and that of the circuit are in the opposite directions, then it will cause even higher window losses. FIG. 1 shows a read sequence for a voltage sensing flash memory, and that is: Pre-charge, Developing, Charge sharing, and Strobe. Among these, Pre-charge means to pre-charge the bit line (BL) to setup the drain side level, Developing means to discharge the BL to setup the drain side level, Charge sharing means the voltage levels of the bit line and that of the node SEN charge share (or maybe the node DSEN as shown in FIG. 5(a)), and strobe means to strobe the sensing data. Thus, how to create a tracking sensing circuit to monitor the sensing operations of, e.g., Pre-charge time, Developing time, Charge sharing time and Strobe time is highly demanded.

Keeping the drawbacks of the prior arts in mind, and employing experiments and research full-heartily and persistently, the applicant finally conceived a flash memory with a read tracking clock and a method thereof.

SUMMARY OF THE INVENTION

It is therefore an object of the present invention to provide a flash memory with a read tracking clock having a better efficiency and a lower power loss, and the efficiency is raised and the power loss is reduced via the utilization of the read tracking clock so as to engage the access operations of the non-volatile memory, for example, a flash memory, more accurately.

According to the first aspect of the present invention, a flash memory having a read tracking clock comprises a current detecting circuit detecting a pre-charge time of the flash memory and comprising a copy circuit, comprising a reference current generator generating a reference current, and having a first terminal and a second terminal connected to a ground, a first switch having a first terminal receiving a power supply voltage, a second terminal coupled to the first terminal of the reference current generator and generating a first charge current, and a control terminal receiving a first bit line clamping signal, and a second switch having a first terminal receiving the power supply voltage, a second terminal generating a second charge current being a copy of the first charge current, and a control terminal receiving the first bit line clamping signal, a mirror circuit reflecting the second charge current to the comparing circuit, and a comparing circuit comparing the second charge current with a second reference current, and sending out a signal indicating the pre-charge time being accomplished when the second reference current is larger than the second charge current.

According to the second aspect of the present invention, a flash memory having a read tracking clock comprises a first tracking circuit detecting a developing time of the flash memory and comprising a first storage capacitor, a first storage cell receiving a first bias and coupled to the first storage capacitor, a second storage capacitor, a second storage cell receiving a second bias and coupled to the second storage capacitor, wherein the second bias is the first bias subtracts a predetermined value, a first current source generating a first current flowing through the first storage capacitor when the first storage cell is conductive, a second current source generating a second current flowing through the second storage capacitor when the second storage cell is conductive, and a first comparator having an inverting terminal electrically connected to the first current source, a non-inverting terminal electrically connected to the second current source and an output terminal sending out a signal indicating the developing time being accomplished when the second current is larger than the first current.

According to the third aspect of the present invention, a flash memory having a read tracking clock comprises a first storage capacitor, a sense amplifier having a latch, a bit line connected with the first storage capacitor at a storage capacitor node, and a charge sharing tracking circuit detecting a charge sharing time of the storage capacitor node and a strobe time and comprising a sense amplifier mimic circuit mimicking the sense amplifier for tracking the charge sharing time and a trigger point of the latch, and comprising a charge sharing node, wherein a signal indicating the charge sharing time being accomplished is sent out when a potential value of the charge sharing node is changed from the power supply voltage to a relatively lower potential value of the storage capacitor node, and a pulse generation circuit generating a strobe pulse signal according to the trigger point of the latch and tracking the strobe time according to the strobe pulse signal.

According to the fourth aspect of the present invention, a copy circuit comprises a reference current generation device generating a first reference current, a first switch coupled to the reference current generation device and generating a first charge current and a second switch generating a second charge current, wherein the second charge current is copied from the first charge current.

According to the fifth aspect of the present invention, a flash memory having a read tracking clock comprises a switch generating a charge current, and a comparing circuit comparing the charge current with a reference current, and sending out a signal indicating a pre-charge time being accomplished when the reference current is larger than the charge current.

According to the sixth aspect of the present invention, a flash memory having a read tracking clock comprises a mirror circuit mirroring a charge current, and a comparator comparing the charge current with a reference current and sending out a signal indicating a pre-charge time being accomplished when the reference current is larger than the charge current.

According to the seventh aspect of the present invention, a flash memory having a read tracking clock comprises a first and a second storage capacitors, a first current source providing a first current flowing through the first storage capacitor, a second current source providing a second current flowing through the second storage capacitor, and a comparator electrically connected to the first and the second current sources, and sending out a signal to indicate a developing time being accomplished when the second current is larger than the first current.

According to the eighth aspect of the present invention, a memory having a read tracking clock comprises a charge sharing node having a potential value, and a charge sharing tracking circuit detecting a time when the potential value is changed from a power supply voltage to a relatively lower potential, for sending out a signal indicating a charge sharing being accomplished.

According to the ninth aspect of the present invention, a memory having a read tracking clock comprises a strobe path having a strobe time, and a pulse generation circuit generating a strobe pulse signal and tracking the strobe time according to the strobe pulse signal.

According to the tenth aspect of the present invention, a method for a flash memory having a sense amplifier mimic circuit, a read tracking clock and a charge sharing node, comprises steps of: providing an input current of the sense amplifier mimic circuit, generating a corresponding read tracking clock by utilizing the current and coping with the sense amplifier mimic circuit; detecting whether a voltage value of the charge sharing node is decreased; and if it is, sending out a signal indicating a charge sharing time being accomplished.

According to the eleventh aspect of the present invention, a method for a flash memory having a sense amplifier and a read tracking clock, wherein the flash memory includes a charge sharing node, comprises steps of: providing an input current of the sense amplifier, generating a corresponding read tracking clock by utilizing the current and coping with the sense amplifier; detecting whether a voltage value of the charge sharing node is decreased; and if it is, sending out a signal indicating a charge sharing time being accomplished.

The present invention may best be understood through the following descriptions with reference to the accompanying drawings, in which:

DETAILED DESCRIPTION OF THE PREFERRED EMBODIMENT

Figure 1:
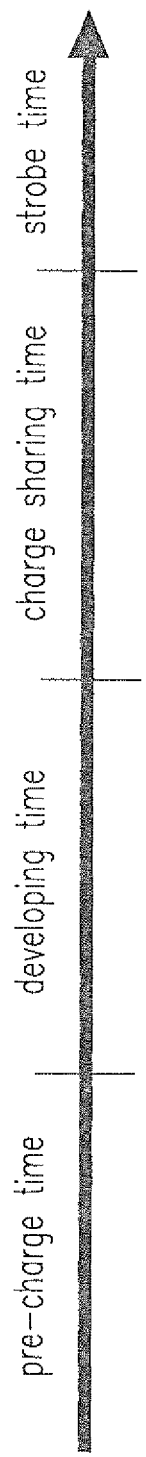
FIG. 1 shows a read sequence for a voltage sensing flash memory.
Figure 2A:
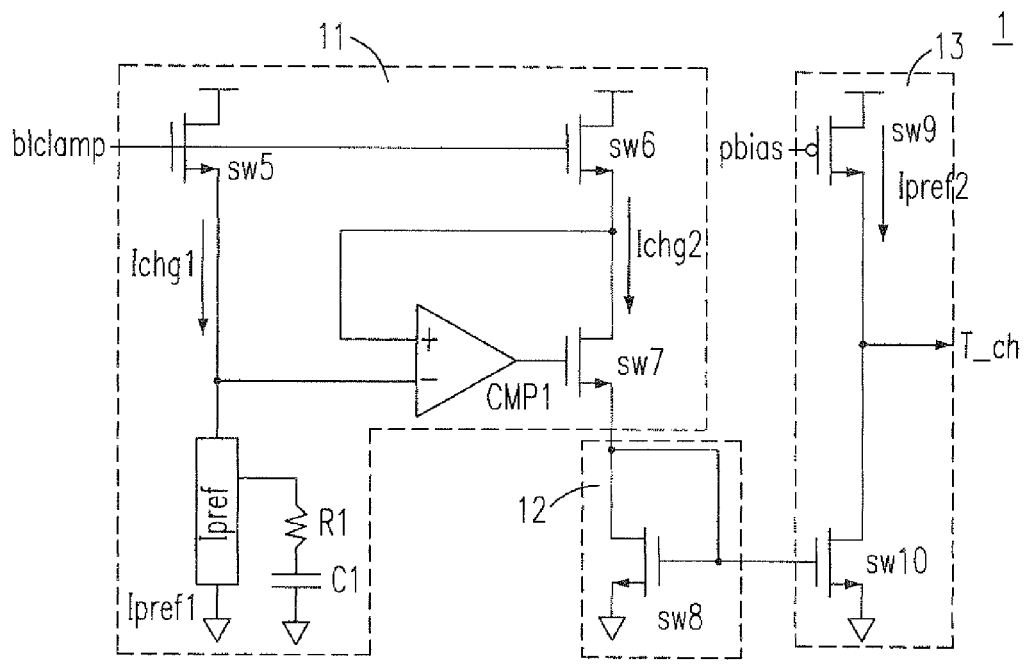
FIG. 2(a) is a circuit diagram of a current detecting circuit according to the first preferred embodiment of the present invention.

FIG. 2(a) is a circuit diagram of a current detecting circuit according to the first preferred embodiment of the present invention. In FIG. 2(a), it shows the current detecting circuit 1 includes a copy circuit 11, a mirror circuit 12 and a comparing circuit 13. The copy circuit 11 comprises switches sw5-sw7, the reference current generator Ipref generating a first reference current Ipref1, R1, C1 and the comparator CMP1. The mirror circuit 12 comprises a switch sw8 (the control terminal of which is electrically connected to the first terminal thereof). The comparing circuit 13 includes switches sw9 (receiving a bias signal pbias) and sw10 and an output terminal outputting a signal T_ch. The copy circuit 11 copies the pre-charge current Ichg1 to the Ichg2, the mirror circuit 12 reflects the pre-charge current Ichg2 to the comparing circuit 13. pbias defines the judgment current, and is a copy of the Ipref1. Ipref2=Ipref1*a factor, where the factor can be an integer or a fraction. When Ipref2 is larger than the pre-charge current Ichg2, it indicates a pre-charge time is accomplished.

Figure 2B:
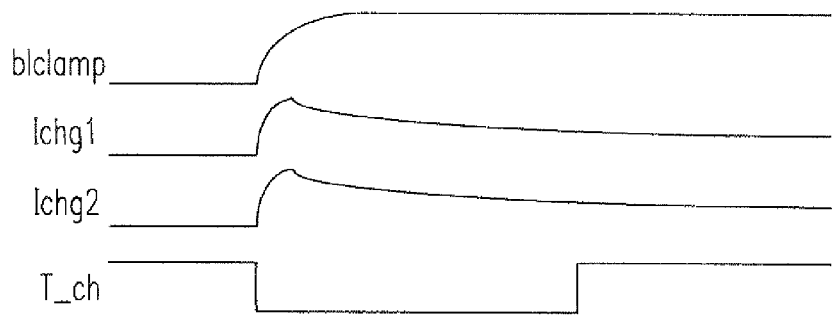
FIG. 2(b) shows simulation waveforms of the bit line clamping signal blclamp, the charge currents Ichg1 and Ichg2, and signal T_ch at the output terminal of the comparing circuit of the current detecting circuit as shown in FIG. 2(a)

FIG. 2(b) shows simulation waveforms of the bit line clamping signal blclamp, the charge currents Ichg1 and Ichg2, and the signal T_ch at the output terminal of the comparing circuit of the current detecting circuit as shown in FIG. 2(a).

Figure 3:
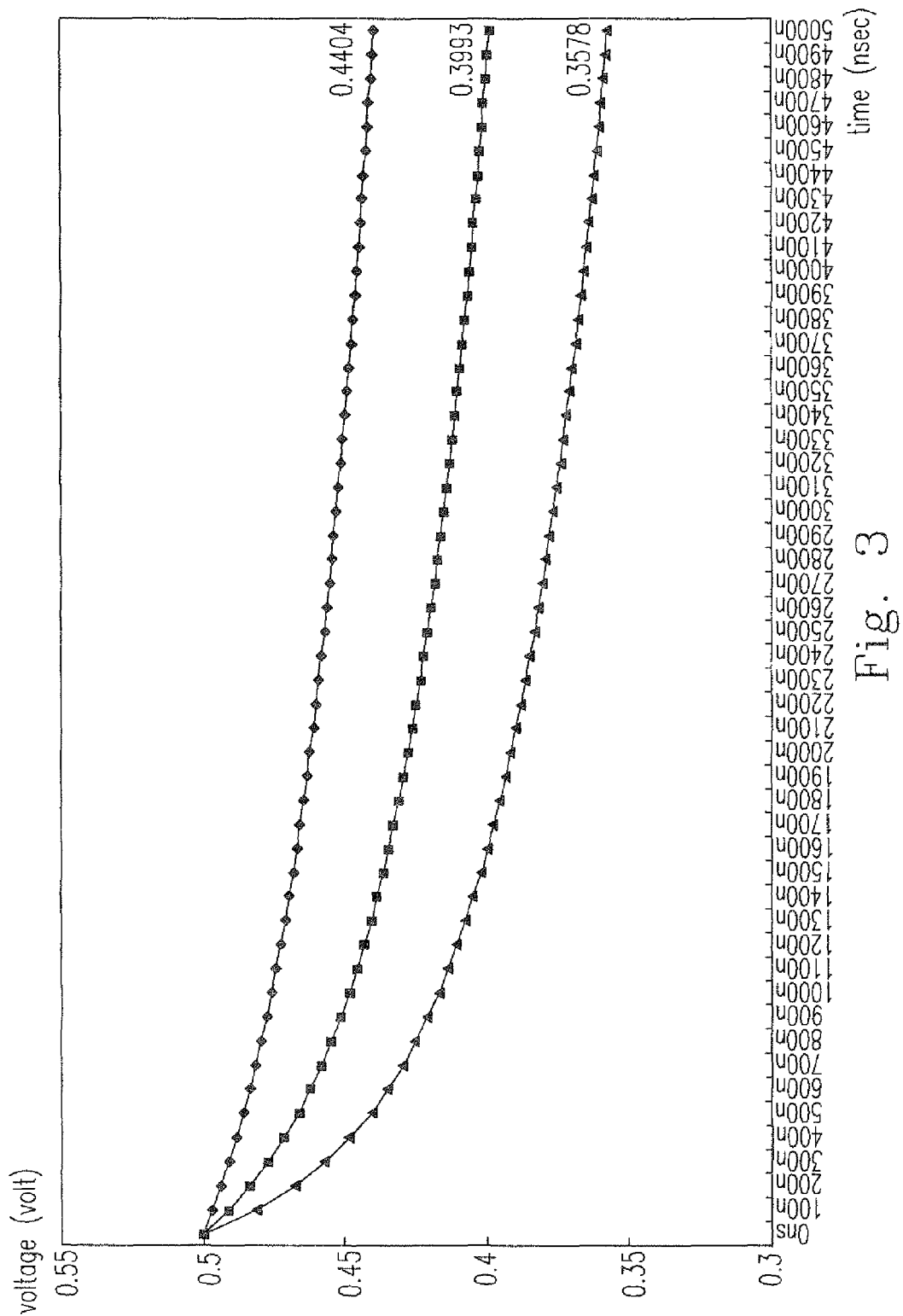
FIG. 3 shows simulation waveforms of the Vgs of the NMOS switch sw5 of the current detecting circuit as shown in FIG. 2(a) under various temperatures.

FIG. 3 shows simulation waveforms of the Vgs of the NMOS switch sw5 of the current detecting circuit as shown in FIG. 2(a) under various temperatures (from −10° C. to 35° C. and then to 80° C.). Smaller Vgs means higher drain side bias. FIG. 3 shows longer pre-charge time and higher cross voltage of storage capacitor (e.g., an MBL) under smaller cell current.

Figure 4A:
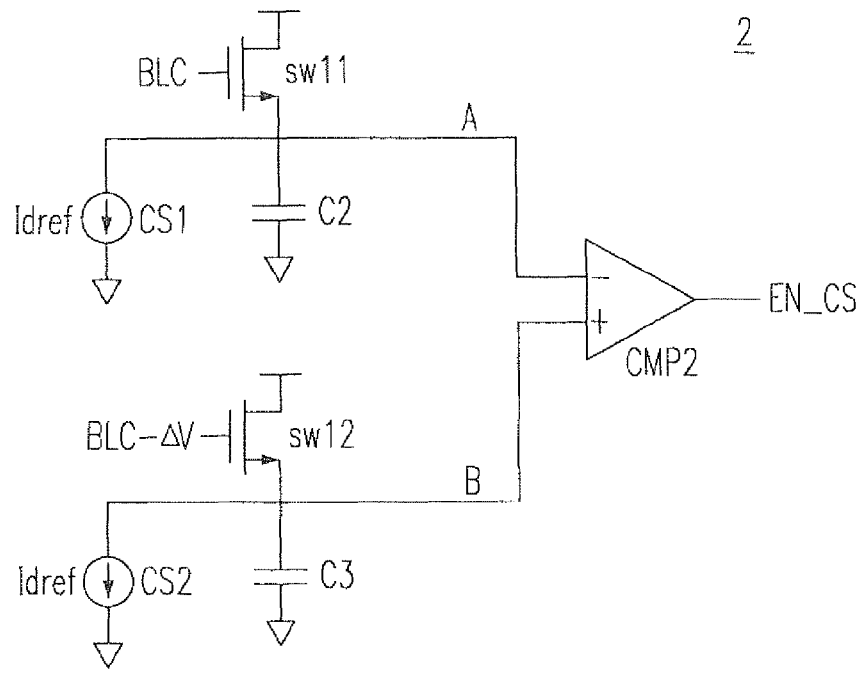
FIG. 4(a) is a circuit diagram of a first tracking circuit according to the second preferred embodiment of the present invention.
Figure 4B:
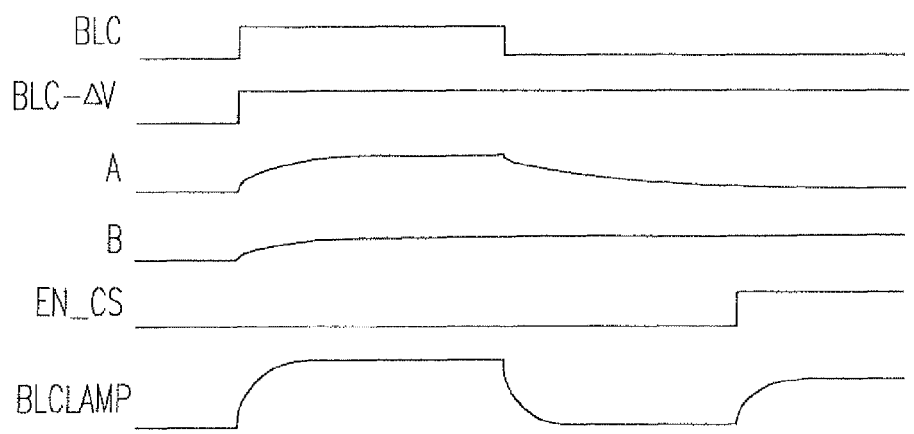
FIG. 4(b) shows simulation waveforms of the biases BLC and BLC-0.2V, the currents on A and B, the output signal of the comparator EN_CS and the bit line clamping signal BLCLAMP of the current detecting circuit as shown in FIG. 4(a)
Figure 5A:
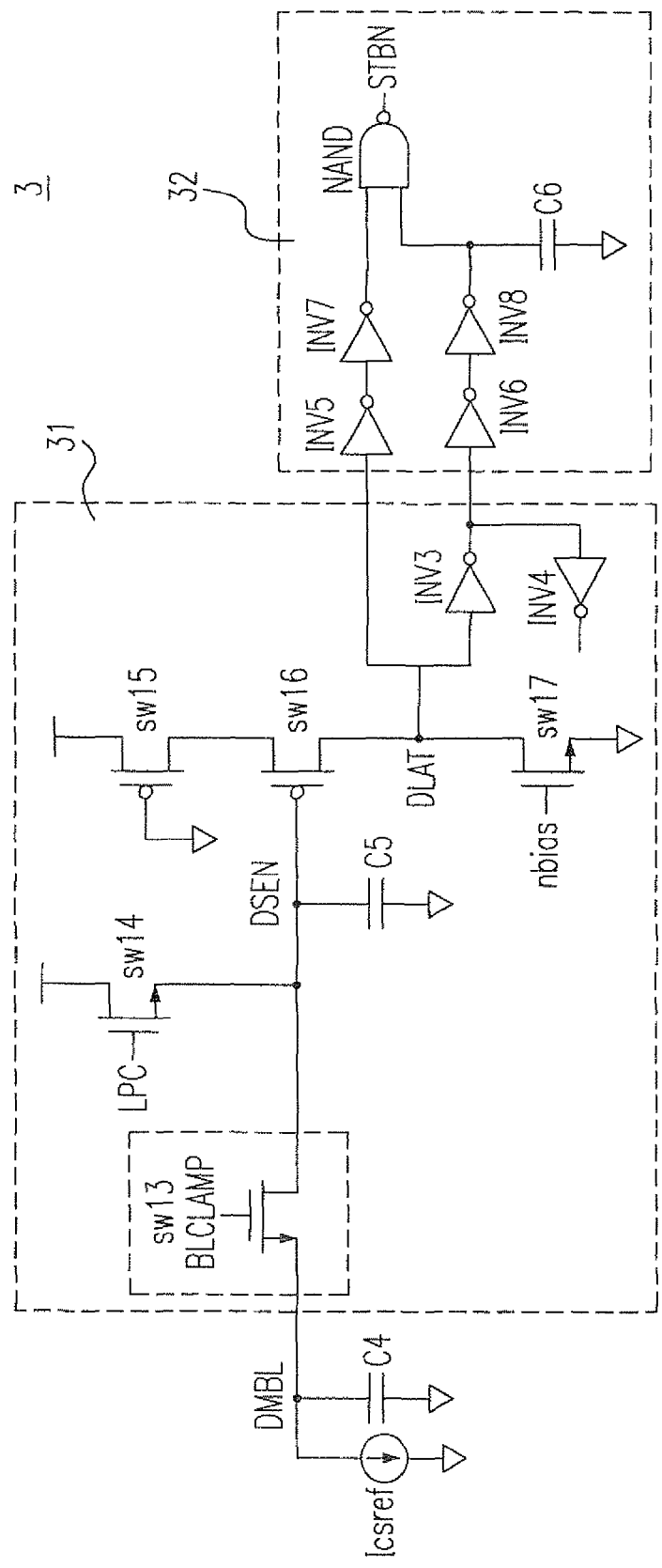
FIG. 5(a) is a circuit diagram of a second tracking circuit applied to the charge sharing time according to the third preferred embodiment of the present invention.

FIG. 4(a) is a circuit diagram of a first tracking circuit according to the second preferred embodiment of the present invention. In FIG. 4(a), the first tracking circuit 2 includes the current sources CS1 and CS2 (both having current Idref), switches sw11 and sw12, and comparator CMP2. The comparator CMP2 outputs a signal EN_CS. When the current on B is larger than that on A, a developing time is accomplished. The first tracking circuit 2 is used to define the developing time of the storage capacitor (e.g., the MBL). In the present invention, the "Idref" and the "BLC-ΔV" can be used to define the developing time. When the developing time is defined, the source side level (SSL) is open, the storage cell connected to a bit line is connected to the storage capacitor (e.g., the MBL) due to its conduction, and the conduction current on the storage cell is used to discharge the capacitance of the storage capacitor (e.g., the MBL). And, longer developing time results in lower storage capacitor (e.g., the MBL) cross voltage. The voltage of the node DMBL as shown in FIG. 5(a) is called the developing voltage. FIG. 4(b) shows simulation waveforms of the biases BLC and BLC-ΔV, the currents on A and B, the output signal of the comparator EN_CS and the bit line clamping signal BLCLAMP of the current detecting circuit as shown in FIG. 4(a).

FIG. 5(a) is a circuit diagram of a second tracking circuit applied to the charge sharing time according to the third preferred embodiment of the present invention. The second tracking circuit 3 comprises a page buffer mimic circuit 31 and a pulse generation circuit 32. The page mimic circuit 31 comprises switches sw13-sw17, capacitor C5 and inverters INV3-INV4. The pulse generation circuit 32 comprises inverters INV5-INV8, a capacitor C6 and a NAND gate NAND, and the output terminal of NAND outputs a signal STBN. The capacitor C4 and the current source Icsref connect the node DMBL. In the present invention, Icsref can be used to define the charge sharing timing. The nbias signal can be either a constant voltage or a pulse signal.

Figure 5B:
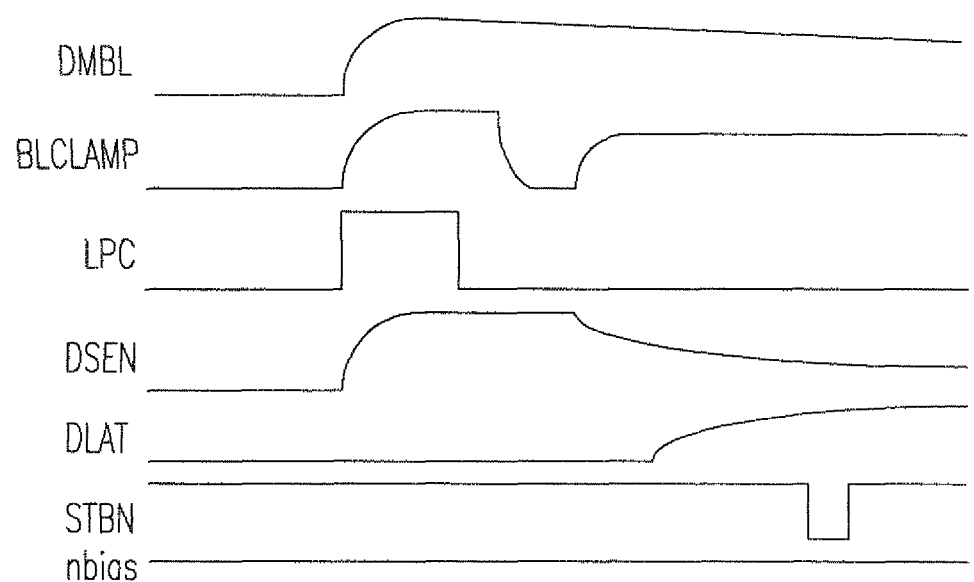
FIG. 5(b) shows simulation waveforms of DMBL, BLCLAMP, LPC, DSEN, DLAT, STBN, and nbias of the second tracking circuit as shown in FIG. 5(a)

FIG. 5(b) shows simulation waveforms of DMBL, BLCLAMP, LPC, DSEN, DLAT, STBN, and nbias of the second tracking circuit as shown in FIG. 5(a).

Figure 6:
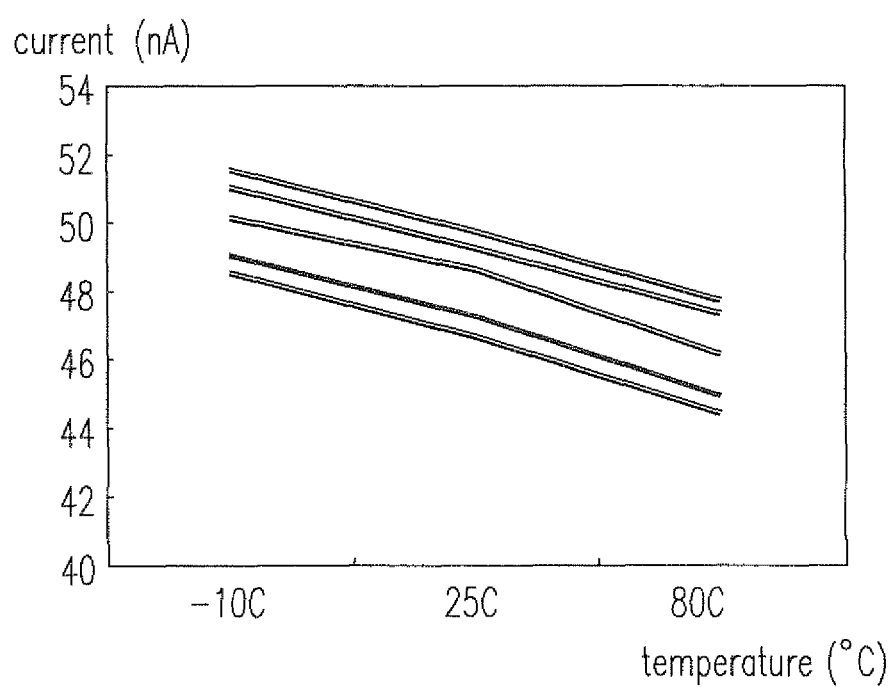
FIG. 6 shows the variations of simulation waveforms of the judgment cell current under various temperature coefficients according to the constant developing timing in the prior art.

FIG. 6 shows the variations of simulation waveforms of the judgment cell current under various temperature coefficients according to the constant developing timing in the prior art are quite large. In −10° C. to 85° C., the variation of the judgment cell current is from 52 nA to 48 nA.

Figure 7:
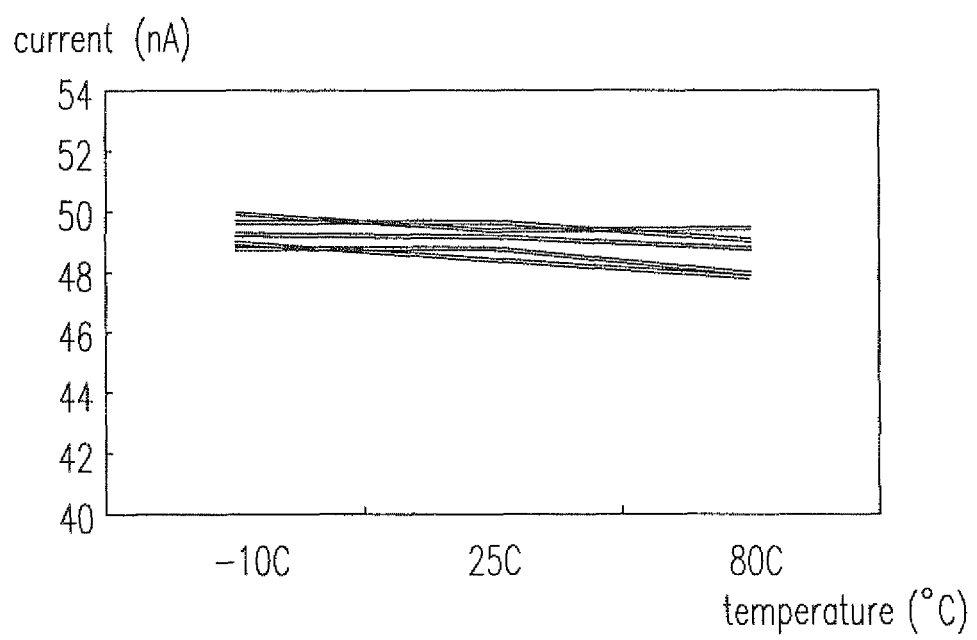
FIG. 7 shows the variations of simulation waveforms of the judgment cell current under various temperature coefficients according to the tracking timing of the present invention.

FIG. 7 shows the variations of simulation waveforms of the judgment cell current under various temperature coefficients according to the tracking timing of the present invention are quite small. In −10° C. to 85° C., the variation of the judgment cell current is from 50 nA to 49.58 nA.

Figure 8:
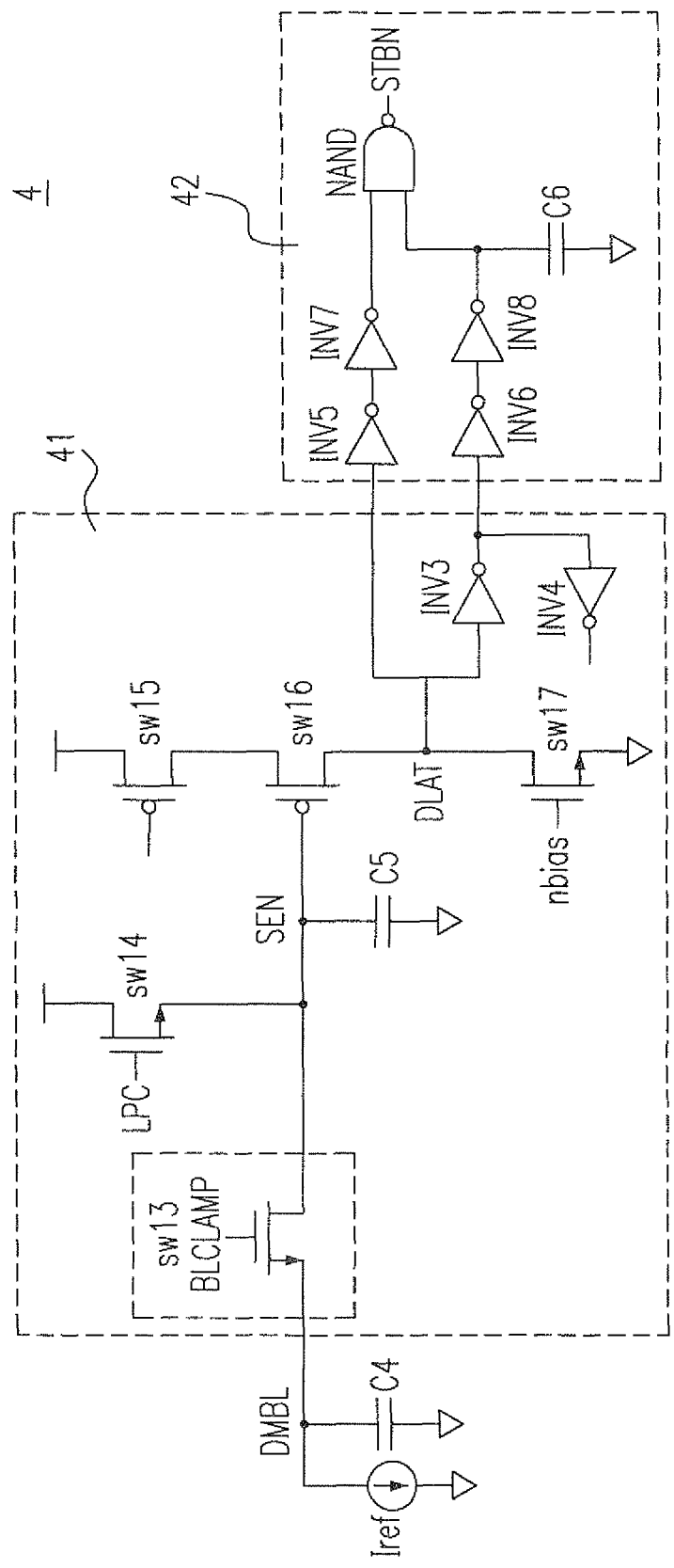
FIG. 8 is a circuit diagram of a second tracking circuit applied to the strobe time according to the third preferred embodiment of the present invention.

FIG. 8 is a circuit diagram of the second tracking circuit 3 applied to the strobe time according to the third preferred embodiment of the present invention. The strobe pulse is defined via the detection of the trigger point of the INV latch of the page buffer such that the strobe time can be defined.

Embodiments

1. A flash memory having a read tracking clock, comprising:
a current detecting circuit detecting a pre-charge time of the flash memory and comprising:
a copy circuit, comprising:
a reference current generator generating a reference current, and having a first terminal and a second terminal connected to a ground;
a first switch having a first terminal receiving a power supply voltage, a second terminal coupled to the first terminal of the reference current generator and generating a first charge current, and a control terminal receiving a first bit line clamping signal; and
a second switch having a first terminal receiving the power supply voltage, a second terminal generating a second charge current being a copy of the first charge current, and a control terminal receiving the first bit line clamping signal;
a mirror circuit reflecting the second charge current to the comparing circuit; and
a comparing circuit comparing the second charge current with a second reference current, and sending out a signal indicating the pre-charge time being accomplished when the second reference current is larger than the second charge current.

2. A flash memory according to Embodiment 1 further comprising:
a first tracking circuit detecting a developing time of the flash memory, and comprising:
a first storage cell having a first terminal receiving a power supply voltage, a second terminal and a control terminal receiving a first bias,
a first storage capacitor having a first terminal electrically connected to the second terminal of the first storage cell and a second terminal connected to a ground;
a second storage cell having a first terminal receiving the power supply voltage, a second terminal and a control terminal receiving a second bias being a difference of the first bias and a predetermined value;
a first current source generating a first current flowing through the first storage capacitor when the first storage cell is conductive;
a second storage capacitor having a first terminal electrically connected to the second terminal of the second storage cell and a second terminal connected to the ground;
a second current source generating a second current flowing through the second storage capacitor when the second storage cell is conductive; and
a first comparator having an inverting terminal electrically connected to the first current source, a non-inverting terminal electrically connected to the second current source and an output terminal sending out a signal of the developing time being accomplished when the second current is larger than the first current.

3. A flash memory according to Embodiment 1 or 2, wherein the copy circuit further comprises a first resistor and a third storage capacitor, each of which has a first and a second terminals, a third switch has a first terminal, a second terminal and a control terminal and a second comparator has an inverting terminal, a non-inverting terminal and an output terminal, the reference current generator further comprises a third terminal, the first terminal of the first resistor is electrically connected to the third terminal of the reference current generator, the second terminal of the first resistor is electrically connected to the first terminal of the third storage capacitor, the second terminal of the third storage capacitor is connected to the ground, the non-inverting terminal of the second comparator is electrically connected to the second terminal of the second switch and the first terminal of the third switch, the inverting terminal of the second comparator is electrically connected to the first terminal of the reference current generator, and the output terminal of the second comparator is electrically connected to the control terminal of the third switch.

4. A flash memory according to anyone of the above-mentioned Embodiments, wherein the mirror circuit comprises a fourth switch having a first terminal, a second terminal and a control terminal, the control terminal of the fourth switch is electrically connected to the first terminal of the fourth switch and the second terminal of the third switch, the second terminal of the fourth switch is connected to the ground, the comparing circuit comprises a fifth and a sixth switches, each of which has a first terminal, a second terminal and a control terminal, and an output terminal, the first terminal of the fifth switch receives the power supply voltage, the control terminal of the fifth switch receives a third bias, the second terminal of the fifth switch is electrically connected to the first terminal of the sixth switch and the output terminal and generates the second reference current, the second reference current is the first reference current multiplied by a factor, the control terminal of the sixth switch is electrically connected to the control terminal of the fourth switch, and the second terminal of the sixth switch is connected to the ground.

5. A flash memory according to anyone of the above-mentioned Embodiments further comprising:
   a sense amplifier having a latch;
   a bit line connected with one of the first and the second storage capacitors at a storage capacitor node;
   a third storage cell coupled to the bit line;
   a third current source generating a third current flowing through the bit line and the storage capacitor node when the third storage cell is conductive;
   a fourth storage capacitor having a first terminal electrically connected to the storage capacitor node and a second terminal connected to the ground; and
   a second tracking circuit detecting a charge sharing time of the storage capacitor node and a strobe time and comprising:
   a sense amplifier mimic circuit mimicking the page buffer for tracking the charge sharing time and a trigger point of the latch; and
   a pulse generation circuit generating a strobe pulse signal according to the trigger point of the latch and tracking the strobe time according to the strobe pulse signal.

6. A flash memory according to anyone of the above-mentioned Embodiments, wherein the sense amplifier mimic circuit comprises a charge sharing node, a seventh switch to the eleventh switch, each of which has a first, a second and a control terminals, a first and a second inverters and a fifth storage capacitor, each of which has a first and a second terminals, wherein the control terminal of the seventh switch receives a second bit line clamping signal, the first terminal of the seventh switch is electrically connected to the second terminal of the eight switch, the second terminal of the seventh switch is electrically connected to the storage capacitor node, the control terminal of the eighth switch receives a fourth bias, the first terminal of the eighth switch receives the power supply voltage, the second terminal of the eighth switch is electrically connected to the first terminal of the fifth storage capacitor and the charge sharing node, the second terminal of the fifth storage capacitor is connected to the ground, the first terminal of the ninth switch receives the power supply voltage, the control terminal of the ninth switch is connected to the ground, the second terminal of the ninth switch is electrically connected to the first terminal of the tenth switch, the second terminal of the tenth switch is electrically connected to the first terminal of the eleventh switch and the first terminal of the first inverter, the control terminal of the tenth switch is electrically connected to the charge sharing node, the control terminal of the eleventh switch receives a fifth bias, the second terminal of the eleventh switch is connected to the ground, the first terminal of the second inverter is electrically connected to the second terminal of the first inverter, and a signal indicating the charge sharing time being accomplished is sent out when a potential value of the charge sharing node is changed from the power supply voltage to a relatively lower potential value of the storage capacitor node.

7. A flash memory according to anyone of the above-mentioned Embodiments, wherein the pulse generation circuit comprises a third to a sixth inverters and a sixth storage capacitor, each of which has a first and a second terminals, and a NAND gate having a first and a second input terminals and an output terminal, wherein the first terminal of the third inverter is electrically connected to the first terminal of the first inverter, the first terminal of the fourth inverter is electrically connected to the second terminal of the first inverter, the first terminal of the fifth inverter is electrically connected to the second terminal of the third inverter, the second terminal of the fifth inverter is electrically connected to the first input terminal of the NAND gate, the first terminal of the sixth inverter is electrically connected to the second terminal of the fourth inverter, the second terminal of the sixth inverter is electrically connected to the first terminal of the sixth storage capacitor and the second input terminal of the NAND gate, the second terminal of the sixth storage capacitor is connected to the ground, and the output terminal of the NAND gate outputs the strobe pulse signal.

8. A flash memory having a read tracking clock, comprising:
   a first tracking circuit detecting a developing time of the flash memory, and comprising:
   a first storage capacitor;
   a first storage cell receiving a first bias and coupled to the first storage capacitor;
   a second storage capacitor;
   a second storage cell receiving a second bias and coupled to the second storage capacitor, wherein the second bias is the first bias subtracts a predetermined value;
   a first current source generating a first current flowing through the first storage capacitor when the first storage cell is conductive;
   a second current source generating a second current flowing through the second storage capacitor when the second storage cell is conductive; and
   a first comparator having an inverting terminal electrically connected to the first current source, a non-inverting terminal electrically connected to the second current source and an output terminal sending out a signal indicating the developing time being accomplished when the second current is larger than the first current.

9. A flash memory according to Embodiment 8 further comprising:
   a current detecting circuit detecting a pre-charge time of the flash memory and comprising:
   a copy circuit, comprising:
   a reference current generator generating a reference current, and having a first terminal and a second terminal connected to a ground;
   a first switch having a first terminal receiving a power supply voltage, a second terminal coupled to the first terminal of the reference current generator and generating a first charge current, and a control terminal receiving a first bit line clamping signal; and
   a second switch having a first terminal receiving the power supply voltage, a second terminal generating a second charge current being a copy of the first charge current, and a control terminal receiving the first bit line clamping signal;
   a mirror circuit reflecting the second charge current to the comparing circuit; and
   a comparing circuit comparing the second charge current with a second reference current, and sending out a signal indicating the pre-charge time being accomplished when the second reference current is larger than the second charge current.

10. A flash memory according to Embodiment 8 or 9 further comprising:
   a sense amplifier having a latch;
   a bit line connected with one of the first and the second storage capacitors at a storage capacitor node; and
   a second tracking circuit detecting a charge sharing time of the storage capacitor node and a strobe time and comprising:
   a sense amplifier mimic circuit mimicking the sense amplifier for tracking the charge sharing time and a trigger point of the latch, and comprising a charge sharing node, wherein a signal indicating the charge sharing time being accomplished is sent out when a potential value of the charge sharing node is changed from the power supply voltage to a relatively lower potential value of the storage capacitor node; and a pulse generation circuit generating a strobe pulse signal according to the trigger point of the latch and tracking the strobe time according to the strobe pulse signal.

11. A flash memory according to anyone of the above-mentioned Embodiments, wherein the first tracking circuit is a charge sharing tracking circuit.

12. A flash memory according to anyone of the above-mentioned Embodiments, wherein the first tracking circuit is a developing time tracking circuit.

13. A method for a flash memory having a read tracking clock and a charge sharing node, comprising steps of:

detecting whether a voltage value of the charge sharing node is decreased; and if it is, sending out a signal indicating the charge sharing time being accomplished.

14. A method according to Embodiment 13, wherein the flash memory further comprises a sense amplifier mimic circuit, and the detecting step further comprises steps of:

providing an input current of the sense amplifier mimic circuit; and generating a corresponding read tracking clock by utilizing the input current and coping with the sense amplifier mimic circuit.

15. A method according to claim 13, wherein the flash memory further comprises a sense amplifier, and the detecting step further comprises steps of:

providing an input current of the sense amplifier; and generating a corresponding read tracking clock by utilizing the input current and coping with the sense amplifier.

According to the aforementioned descriptions, the present invention provides a flash memory with a read tracking clock having a better efficiency and a lower power loss, and the efficiency is raised and the power loss is reduced via the utilization of the read tracking clock so as to engage the access operations of the non-volatile memory, for example, a flash memory, more accurately so as to possess the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A flash memory having a read tracking clock, comprising:

a current detecting circuit detecting a pre-charge time of the flash memory and comprising:

a copy circuit, comprising:

a reference current generator generating a reference current, and having a first terminal and a second terminal connected to a ground;

a first switch having a first terminal receiving a power supply voltage, a second terminal coupled to the first terminal of the reference current generator and generating a first charge current, and a control terminal receiving a first bit line clamping signal; and a second switch having a first terminal receiving the power supply voltage, a second terminal generating a second charge current being a copy of the first charge current, and a control terminal receiving the first bit line clamping signal;

a mirror circuit reflecting the second charge current to a comparing circuit; wherein and the comparing circuit comparing the second charge current with a second reference current, and sending out a signal indicating the pre-charge time being accomplished when the second reference current is larger than the second charge current.

2. A flash memory according to claim 1 further comprising:

a first tracking circuit detecting a developing time of the flash memory, and comprising:

a first storage cell having a first terminal receiving a power supply voltage, a second terminal and a control terminal receiving a first bias, a first storage capacitor having a first terminal electrically connected to the second terminal of the first storage cell and a second terminal connected to a ground;

a second storage cell having a first terminal receiving the power supply voltage, a second terminal and a control terminal receiving a second bias being a difference of the first bias and a predetermined value;

a first current source generating a first current flowing through the first storage capacitor when the first storage cell is conductive;

a second storage capacitor having a first terminal electrically connected to the second terminal of the second storage cell and a second terminal connected to the ground;

a second current source generating a second current flowing through the second storage capacitor when the second storage cell is conductive; and a first comparator having an inverting terminal electrically connected to the first current source, a non-inverting terminal electrically connected to the second current source and an output terminal sending out a signal of the developing time being accomplished when the second current is larger than the first current.

3. A flash memory according to claim 2, wherein the copy circuit further comprises a first resistor and a third storage capacitor, each of which has a first and a second terminals, a third switch has a first terminal, a second terminal and a control terminal and a second comparator has an inverting terminal, a non-inverting terminal and an output terminal, the reference current generator further comprises a third terminal, the first terminal of the first resistor is electrically connected to the third terminal of the reference current generator, the second terminal of the first resistor is electrically connected to the first terminal of the third storage capacitor, the second terminal of the third storage capacitor is connected to the ground, the non-inverting terminal of the second comparator is electrically connected to the second terminal of the second switch and the first terminal of the third switch, the inverting terminal of the second comparator is electrically connected to the first terminal of the reference current generator, and the output terminal of the second comparator is electrically connected to the control terminal of the third switch.

4. A flash memory according to claim 3, wherein the mirror circuit comprises a fourth switch having a first terminal, a second terminal and a control terminal, the control terminal of the fourth switch is electrically connected to the first terminal of the fourth switch and the second terminal of the third switch, the second terminal of the fourth switch is connected to the ground, the comparing circuit comprises a fifth and a sixth switches, each of which has a first terminal, a second terminal and a control terminal, and an output terminal, the first terminal of the fifth switch receives the power supply voltage, the control terminal of the fifth switch receives a third bias, the second terminal of the fifth switch is electrically connected to the first terminal of the sixth switch and the output terminal and generates the second reference current, the second reference current is the first reference current multiplied by a factor, the control terminal of the sixth switch is electrically connected to the control terminal of the fourth switch, and the second terminal of the sixth switch is connected to the ground.

5. A flash memory according to claim 4 further comprising:
a sense amplifier having a latch;
a bit line connected with one of the first and the second storage capacitors at a storage capacitor node;
a third storage cell coupled to the bit line;
a third current source generating a third current flowing through the bit line and the storage capacitor node when the third storage cell is conductive;
a fourth storage capacitor having a first terminal electrically connected to the storage capacitor node and a second terminal connected to the ground; and
a second tracking circuit detecting a charge sharing time of the MBL and a strobe time; and comprising:
  a sense amplifier mimic circuit mimicking the sense amplifier for tracking the charge sharing time and a trigger point of the latch; and
  a pulse generation circuit generating a strobe pulse signal according to the trigger point of the latch and tracking the strobe time according to the strobe pulse signal.

6. A flash memory according to claim 5, wherein the sense amplifier mimic circuit comprises a charge sharing node, a seventh switch to the eleventh switch, each of which has a first, a second and a control terminals, a first and a second inverters and a fifth storage capacitor, each of which has a first and a second terminals, wherein the control terminal of the seventh switch receives a second bit line clamping signal, the first terminal of the seventh switch is electrically connected to the second terminal of the eight switch, the second terminal of the seventh switch is electrically connected to the storage capacitor node, the control terminal of the eighth switch receives a fourth bias, the first terminal of the eighth switch receives the power supply voltage, the second terminal of the eighth switch is electrically connected to the first terminal of the fifth storage capacitor and the charge sharing node, the second terminal of the fifth storage capacitor is connected to the ground, the first terminal of the ninth switch receives the power supply voltage, the control terminal of the ninth switch is connected to the ground, the second terminal of the ninth switch is electrically connected to the first terminal of the tenth switch, the second terminal of the tenth switch is electrically connected to the first terminal of the eleventh switch and the first terminal of the first inverter, the control terminal of the tenth switch is electrically connected to the charge sharing node, the control terminal of the eleventh switch receives a fifth bias, the second terminal of the eleventh switch is connected to the ground, the first terminal of the second inverter is electrically connected to the second terminal of the first inverter, and a signal indicating the charge sharing time being accomplished is sent out when a potential value of the charge sharing node is changed from the power supply voltage to a relatively lower potential value of the storage capacitor node.

7. A flash memory according to claim 5, wherein the pulse generation circuit comprises a third to a sixth inverters and a sixth storage capacitor, each of which has a first and a second terminals, and a NAND gate having a first and a second input terminals and an output terminal, wherein the first terminal of the third inverter is electrically connected to the first terminal of the first inverter, the first terminal of the fourth inverter is electrically connected to the second terminal of the first inverter, the first terminal of the fifth inverter is electrically connected to the second terminal of the third inverter, the second terminal of the fifth inverter is electrically connected to the first input terminal of the NAND gate, the first terminal of the sixth inverter is electrically connected to the second terminal of the fourth inverter, the second terminal of the sixth inverter is electrically connected to the first terminal of the sixth storage capacitor and the second input terminal of the NAND gate, the second terminal of the sixth storage capacitor is connected to the ground, and the output terminal of the NAND gate outputs the strobe pulse signal.

8. A flash memory having a read tracking clock, comprising:
a first tracking circuit detecting a developing time of the flash memory, and comprising:
  a first storage capacitor;
  a first storage cell receiving a first bias and coupled to the first storage capacitor;
  a second storage capacitor;
  a second storage cell receiving a second bias and coupled to the second storage capacitor, wherein the second bias is the first bias subtracts a predetermined value;
  a first current source generating a first current flowing through the first storage capacitor when the first storage cell is conductive;
  a second current source generating a second current flowing through the second storage capacitor when the second storage cell is conductive; and
  a first comparator having an inverting terminal electrically connected to the first current source, a non-inverting terminal electrically connected to the second current source and an output terminal sending out a signal indicating the developing time being accomplished when the second current is larger than the first current.

9. A flash memory according to claim 8 further comprising:
a current detecting circuit detecting a pre-charge time of the flash memory and comprising:
  a copy circuit, comprising:
    a reference current generator generating a reference current, and having a first terminal and a second terminal connected to a ground;
    a first switch having a first terminal receiving a power supply voltage, a second terminal coupled to the first terminal of the reference current generator and generating a first charge current, and a control terminal receiving a first bit line clamping signal; and
    a second switch having a first terminal receiving the power supply voltage, a second terminal generating a second charge current being a copy of the first charge current, and a control terminal receiving the first bit line clamping signal;
  a mirror circuit reflecting the second charge current to the comparing circuit; and
  a comparing circuit comparing the second charge current with a second reference current, and sending out a signal indicating the pre-charge time being accomplished when the second reference current is larger than the second charge current.

10. A flash memory according to claim 9 further comprising:
   a sense amplifier having a latch;
   a bit line connected with one of the first and the second storage capacitors at a storage capacitor node; and
   a second tracking circuit detecting a charge sharing time of the storage capacitor node and a strobe time and comprising:
      a sense amplifier mimic circuit mimicking the sense amplifier for tracking the charge sharing time and a trigger point of the latch, and comprising a charge sharing node, wherein a signal indicating the charge sharing time being accomplished is sent out when a potential value of the charge sharing node is changed from the power supply voltage to a relatively lower potential value of the storage capacitor node; and
      a pulse generation circuit generating a strobe pulse signal according to the trigger point of the latch and tracking the strobe time according to the strobe pulse signal.

11. A flash memory according to claim 10, wherein the second tracking circuit is a charge sharing tracking circuit.

12. A flash memory according to claim 8, wherein the first tracking circuit is a developing time tracking circuit.

13. A method for a flash memory having a read tracking clock and a charge sharing node, comprising steps of:
   detecting whether a voltage value of the charge sharing node is decreased; and
   if it is, sending out a signal indicating a charge sharing time being accomplished.

14. A method according to claim 13, wherein the flash memory further comprises a sense amplifier mimic circuit, and the detecting step further comprises steps of:
   providing an input current of the sense amplifier mimic circuit; and
   generating a corresponding read tracking clock by utilizing the input current and coping with the sense amplifier mimic circuit.

15. A method according to claim 13, wherein the flash memory further comprises a sense amplifier, and the detecting step further comprises steps of:
   providing an input current of the sense amplifier; and
   generating a corresponding read tracking clock by utilizing the input current and coping with the sense amplifier.

* * * * *